United States Patent [19]
Matsuki

[11] Patent Number: 6,081,417
[45] Date of Patent: Jun. 27, 2000

[54] CAPACITOR HAVING A FERROELECTRIC LAYER

[75] Inventor: Takeo Matsuki, Tokyo, Japan

[73] Assignee: NEC Corporation, Tokyo, Japan

[21] Appl. No.: 09/073,519

[22] Filed: May 6, 1998

[30] Foreign Application Priority Data

May 26, 1997 [JP] Japan ................................. 9-135455

[51] Int. Cl.⁷ .................................................. H01G 4/06
[52] U.S. Cl. ........................ 361/311; 361/313; 361/321.2; 257/296
[58] Field of Search .................. 361/305, 306.1, 361/311–313, 320, 321.1–321.5, 322; 257/295, 296, 306, 310, 528, 532; 438/240, 239, 396, 252

[56] References Cited

U.S. PATENT DOCUMENTS

| | | | |
|---|---|---|---|
| 5,293,510 | 3/1994 | Takenaka | 257/295 |
| 5,369,296 | 11/1994 | Kato | 257/295 |
| 5,382,817 | 1/1995 | Kashihara et al. | 257/295 |
| 5,475,248 | 12/1995 | Takenaka | 257/295 |
| 5,495,117 | 2/1996 | Larson | 257/295 |
| 5,744,832 | 4/1998 | Wolters et al. | 257/295 |
| 5,804,850 | 9/1998 | Evans, Jr. et al. | 257/295 |
| 5,841,160 | 11/1998 | Nakamura | 257/295 |
| 5,866,926 | 2/1999 | Takenaka | 257/295 |

FOREIGN PATENT DOCUMENTS

| | | |
|---|---|---|
| 537791A | 4/1993 | European Pat. Off. . |
| 5-110110 | 4/1993 | Japan . |
| 6-275792 | 9/1994 | Japan . |
| 7-161854 | 6/1995 | Japan . |

*Primary Examiner*—Kristine Kincaid
*Assistant Examiner*—Anthony Dinkins
*Attorney, Agent, or Firm*—Hutchins, Wheeler & Dittmar

[57] ABSTRACT

A capacitor is produced by forming, on an area of a lower electrode which is inside the outer periphery of the lower electrode, a ferroelectric layer which becomes a capacitive part, in a state that the side of the ferroelectric layer is covered by an insulator, and then forming an upper electrode on the ferroelectric layer.

11 Claims, 6 Drawing Sheets

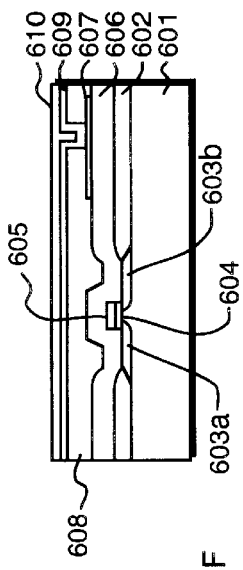
FIG. 6F
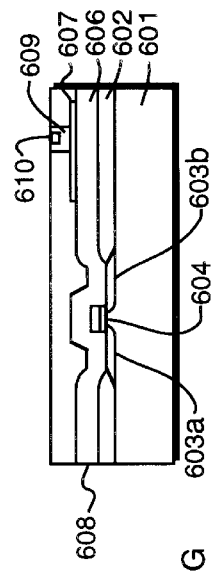
FIG. 6G
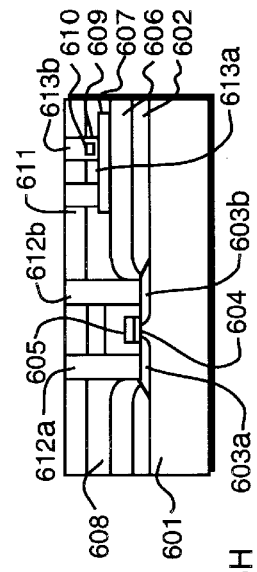
FIG. 6H
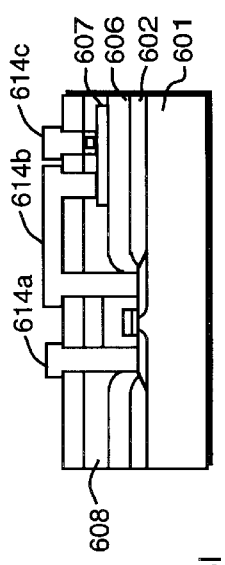
FIG. 6I
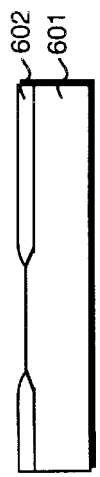
FIG. 6A
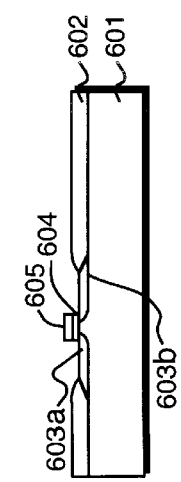
FIG. 6B
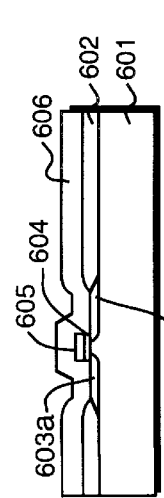
FIG. 6C
FIG. 6D
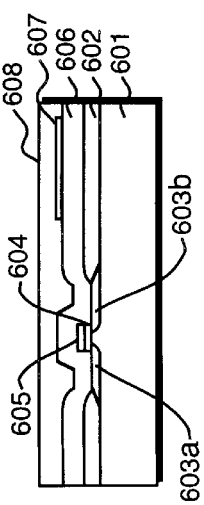
FIG. 6E

CAPACITOR HAVING A FERROELECTRIC LAYER

BACKGROUND OF THE INVENTION

1. Field of the Invention

The present invention relates to a dielectric capacitor which is useful as a capacitor for large scale integrated circuit (LSI), particularly as a capacitor for memory, as well as to a process for producing the dielectric capacitor.

2. Description of the Related Art

Currently, researches and developments, or proposals are being made on ferroelectric non-volatile memories obtained by integration of a capacitor using, as its capacitive insulating layer, a ferroelectric such as PZT ($PbZr_xTi_{1-x}O_3$), $SrBi_2Ta_2O_9$ or the like. An example thereof is a memory cell comprising one transistor and one capacitor, described in Japanese Patent Application Laid-Open No. 275792/1994. This memory cell is explained with reference to FIG. 7. In the memory cell, on a silicon substrate 701 are formed (1) a MOS (metal oxide semiconductor) transistor comprising source and drain gates and (2) a capacitor (isolated and insulated from the transistor by an insulating layer 712), comprising an upper electrode 708, a lower electrode 706 and a ferroelectric 707 interposed between the two electrodes; in the insulating layer 712 isolating the above two elements (1) and (2) are formed contact holes 710a, 710b, 710c and 710d communicating with a source region, a drain region, the lower electrode and the upper electrode; a metal is filled in at least one layer in these contact holes; and wiring metal layers 711a, 711b and 711c are contacted with the metal filled in the contact holes.

In FIG. 7, 702a and 702b refer to source and drain regions; 703 refers to a field oxide layer; 704 refers to a gate oxide layer; 705 refers to a gate electrode; and 709a and 709b each refer to a barrier metal layer. 711a and 711b each refer to an metal wiring.

Also in Japanese Patent Application Laid-Open No. 110110/1993 is disclosed a structure as shown in FIG. 8, in which a ferroelectric 807 constituting a capacitor is disposed in a grove formed in the portion of a silicon substrate where the source and drain layer 804 (a diffused layer containing a high concentration of a dopant) of a transistor is disposed.

In FIG. 8, 801 refers to a P type silicon substrate; 802 refers to a LOCOS isolating layer; 803 and 804 are a source and a drain; 805 refers to a gate electrode; 806 refers to an insulating layer for layer insulation; 808 refers to an upper electrode; 809 refers to an insulating layer for layer insulation; and 810a and 810b are each an aluminum wiring.

Also in Japanese Patent Application No. 161854/1995 is disclosed a memory cell in which a capacitor is disposed in the back channel of a thin-layer transistor and the polarization property of the capacitor is reversed by a weak current. This memory cell is formed as shown in FIG. 9. That is, a polycrystalline silicon layer 903 is formed on a field oxide layer 902 formed on a silicon substrate 901; thereon is formed a silicon oxide layer 904; then, a groove is formed in the silicon oxide layer 904; in the groove is filled a ferroelectric (e.g. PZT) 905; on the ferroelectric 905 is formed, via a silicon oxide layer 906, a thin-layer transistor having diffused layers as source and drain regions. The silicon oxide layer 906 formed between the ferroelectric and the active layer of the thin-layer transistor is for controlling the level difference appearing at the interface between the ferroelectric (particularly PZT layer) and the silicon layer.

In FIG. 9, 907a and 907c refer to a source and a drain; 907b refers to a channel region; 908 refers to a gate oxide layer; 909 refers to a gate polysilicon; 910 refers to a contact hole; and 911 refers to a bit line.

In production of a capacitor used in conventional LSI's such as above-mentioned memory cells, there have been the following problems.

The first problem is the quality deterioration of ferroelectric occurring during the formation of insulating layer for layer insulation. For example, in the ferroelectric memory cell described in Japanese Patent Application Laid-Open No. 275792/1994, the ferroelectric of capacitor formed on the lower electrode is exposed, during the formation of a silicon oxide layer 712 (an insulating layer for layer insulation), to an atmosphere for formation of the layer 712. This atmosphere is a reducing atmosphere containing a high concentration of hydrogen, when the silicon oxide layer 712 is formed from silane by CVD; therefore, when the ferroelectric is made of an oxide, the surface thereof is reduced and deteriorated.

The second problem occurs when the silicon oxide layer formed contains a large amount of water. When a boron or phosphorus-containing silicon oxide layer [e.g. BPSG (borophosphosilicate glass) layer, BSG (borosilicate glass) layer or PSG (phosphosilicate glass) layer] or an ozone-TEOS (tetraethoxysilane) layer (this layer is formed at low temperatures) is formed so as to cover the capacitor, the silicon oxide layer contains a large amount of water in some cases, which may deteriorate the leak current property and insulation property of capacitor.

The third problem is appearance of difference in levels and an increase in number of steps. For example, when a ferroelectric element is formed on a field oxide layer 703 as shown in FIG. 7 (Japanese Patent Application Laid-Open No. 275792/1994), the difference in levels appearing in an outermost layer 712 is very large owing to the formation of a lower electrode 706, a dielectric layer 707, etc., making difficult one-shot focussing in light exposure for holes making. Hence, focussing and light exposure must be made to each different level to form individual contact holes, inviting an increase in number of steps. When, in this constitution, the insulating layer for layer insulation is formed so as to have a flat surface based on the thickness of the part of the insulating layer on the capacitor, the thickness of the insulating layer is too large depending upon its position, which may make too large the depths of some contact holes and may make difficult the implantation of wiring metal in these holes.

As the fourth problem, there can be mentioned the problems occurring when a ferroelectric and silicon are in direct contact, as seen in the structures of FIG. 8 (Japanese Patent Application Laid-Open No. 110110/1993) and FIG. 9 (Japanese Patent Application Laid-Open No. 161854/1995); that is, a problem that a ferroelectric metal and silicon react with each other easily during the heating step for formation of ferroelectric layer and a problem that, during the heating step, silicon is easily oxidized and thereby a silicon oxide layer is easily formed between the ferroelectric and the silicon layer. In general, a ferroelectric has a dielectric constant considerably larger than that of a silicon oxide layer. Therefore, when a silicon oxide layer is formed between the ferroelectric layer and the silicon layer, there is formed a structure in which a dielectric of larger dielectric constant and a dielectric of small dielectric constant are interposed in series between two electrodes; when a voltage is applied to this structure, the voltage is distributed so that a higher voltage is applied to the dielectric of small dielectric constant. In other words, a voltage is applied to the silicon oxide layer formed between the ferroelectric and silicon and, as a result, the ferroelectric is unable to show a desired polarization property.

The fifth problem is the formation of short circuit between upper and lower electrodes, which may occur in producing a capacitor comprising an upper electrode, a lower electrode and a ferroelectric interposed between the two electrodes, according to a conventional process by using, as a metal for electrode, a sparingly reactive metal (e.g. Pt or Au). The process for producing a capacitor is largely classified into the following three processes from the reasons of circuit designing. The first process is a process which comprises forming a lower electrode layer, a ferroelectric layer and an upper electrode layer successively in this order and then etching, using a mask, these three layers in the order of the upper electrode layer to the lower electrode layer so as to give a desired shape. The second process is a two-step process which comprises forming a lower electrode layer, processing the layer into a desired shape, then forming thereon a ferroelectric layer and an upper electrode layer in this order, and processing the two layers into a desired shape. The third process is a two-step process which comprises forming a lower electrode layer and a ferroelectric layer, processing them into a desired shape, then forming an upper electrode layer, and processing the layer into a desired shape. In the first and second processes, the lower electrode is subjected to plasma etching after the ferroelectric layer beneath the upper electrode has been etched. At this time, when the lower electrode is made of a sparingly reactive metal, the metal surface is hit by the accelerated ion in plasma; the sputtered metal atoms adhere to the side of the already shaped ferroelectric layer; thereby, a side wall layer may be formed. When the side wall layer made of a sparingly reactive metal grows to such an extent as the layer connects the upper and lower electrodes, a short circuit is formed and no desired capacity property is obtained. In the third process as well, there may occur the short-circuiting between the upper and lower electrodes owing to the wrong positioning during light exposure. That is, when an upper electrode layer is formed on a shaped lower electrode and a shaped ferroelectric layer and the resulting material is subjected to light exposure and etching, the size of a mask for light exposure is made smaller than the sizes of the shaped lower electrode and the shaped ferroelectric layer so that the contact area between the lower electrode and the upper electrode layer can be etched. At this time, if wrong positioning is made in light exposure, some part of the contact area between the lower electrode and the upper electrode layer is covered by an etching resist and remains unetched, which invites short-circuiting. Precise positioning can be achieved by making large the difference between the size of upper electrode and the sizes of ferroelectric and lower electrode. However, the size of capacitor is inevitably small in order to achieve high integration, which in turn makes it impossible to secure the area sufficient for the above large difference between the size of upper electrode and the sizes of ferroelectric and lower electrode.

SUMMARY OF THE INVENTION

An object of the present invention is to provide a process for producing a capacitor used in LSI devices, etc. which can effectively prevent the short-circuiting occurring between upper and lower electrodes and assure a desired capacity property even when the electrode(s) is (are) made of a metal material of low reactivity and further which can be produced even in a small size.

Other object of the present invention is to provide a process for producing a capacitor used in LSI devices, etc., which process can effectively prevent (1) the quality deterioration of ferroelectric layer during the formation of insulating layer for coverage of capacitor and (2) the reduction in capacity, caused by the remaining of water in formed insulating layer.

Still other object of the present invention is to provide a process for producing a capacitor, which process can prevent an increase in the number of the steps required for production of capacitor per se and also an increase in the number of the steps required for production of the capacitor part of capacitor-containing LSI device or the like.

According to the present invention there is provided a process for producing a capacitor comprising an upper electrode, a lower electrode and a capacitive part made of a ferroelectric, interposed between the upper and lower electrodes, at least one of the electrodes having a single-layer or multi-layer structure made of a metal sparingly reactive with oxygen, or a metal having conductivity even when oxidized to become an oxide, or a conductive metal oxide, which process comprises:

forming a lower electrode, forming, on the lower electrode, an insulating layer having a dielectric constant smaller than that of said ferroelectric and then removing a portion of the insulating layer which is inside the outer periphery of the lower electrode, to form, in the insulating film, an opening so as to reach the lower electrode, forming a capacitive part made of a ferroelectric, in the opening, and forming an upper electrode on the capacitive part.

In the production process of the present invention, when the upper electrode has been formed, the upper surface of the lower electrode is covered by the ferroelectric layer and the insulating layer, whereby the short-circuiting between the lower electrode and the upper electrode can be prevented reliably.

Further, when the capacitor is produced in an integrated circuit by the present process, since the insulating layer for layer insulation isolating the capacitor and other element is formed before the formation of the ferroelectric layer and, moreover, the side of the ferroelectric layer constituting the capacitive part is covered by the insulating layer, there can be avoided adverse effects, for example, the quality deterioration of the ferroelectric layer which occurs when the insulating layer for layer insulation is formed after the formation of the ferroelectric layer.

Therefore, the material for the insulating layer and the process for production of the layer can each be selected from a wide range. Incidentally, since the lower electrode is made of a metal, there is no formation of $SiO_2$ which appears at the interface between the ferroelectric layer and the lower electrode when silicon is used in place of the metal and which becomes a parasitic capacitance component.

When the insulating layer is formed on the lower electrode as a SOG layer by the use of spin coating, the insulating layer can have a flat surface without employing a flattening operation such as polishing or the like. Further, by subjecting the insulating layer to low-temperature drying and then to a heat treatment in an oxygen-containing atmosphere to remove water from the insulating layer, it is possible not only to avoid the quality deterioration of the ferroelectric layer caused by the remaining of water in the insulating layer, but also to obtain an insulating layer of higher density. Furthermore, when the insulating layer is formed as a layer of BPSG, PSG, BSG or the like, the surface of the insulating layer can be made flat by a heat treatment. Moreover, when the insulating layer is formed as a silicon oxide layer by CVD, the insulating layer can be formed rapidly, which makes it possible to use a low-melting material in the formation of a layer(s) which is (are) present beneath the lower electrode.

By forming, on the insulating layer (formed on the lower electrode) and also in the opening (formed in the insulating layer so as to reach the lower electrode), a ferroelectric layer and an upper electrode layer successively in this order and then removing the unnecessary portions of the ferroelectric layer and the upper electrode layer on the insulating layer, it is possible to reduce the times of light exposure. When the surface of the insulating layer and the surface of the upper electrode are allowed to have the same height, chemical mechanical polishing can be used for the above removal of the unnecessary portions and a flat surface can easily be obtained after the polishing. By using this polishing, the resulting capacitor can provide an LSI device or the like of higher reliability. Incidentally, a capacitor of a type wherein the ferroelectric layer has a hollow at the surface and the upper electrode is disposed in the hollow, is convenient for making the surface flat.

When the unnecessary portions on the insulting layer is removed by chemical mechanical polishing, it is also possible to avoid the adverse effect give on the ferroelectric layer by ion, as seen in using a plasma. Moreover, since the surface flattening by chemical mechanical polishing can be conducted at low temperatures, the lower electrode and other element (which may be formed beneath the capacitor) can each be made of a low-melting material.

In the present process, it is possible that a ferroelectric layer, an upper electrode layer and a silicon oxide layer are formed in this order on the insulating layer (formed on the lower electrode) and also in the opening (formed in the insulating layer so as to reach the lower electrode), then the surface of the resulting material is made flat, and etching is conducted until the insulating layer is exposed. In this case, a heat treatment may be applied after the etching to alleviate the adverse effect given on the ferroelectric layer during the etching. By using spin coating in the above formation of a silicon oxide layer, a flat surface can be easily obtained, making it unnecessary to conduct any surface-flattening operation. That is, by forming a silicon oxide layer on the upper electrode layer as a SOG layer by spin coating using a SOG solution, the resulting silicon oxide layer is thick at the hollow on the opening in the insulating layer and thin at other areas and can have a flat surface. By, in this state, etching back the whole surface of the silicon oxide layer until the upper surface of the insulating layer is exposed, the unnecessary portions of the ferroelectric layer and the upper electrode layer on the insulating layer are removed and there can be formed, in the space including the opening on the lower electrode, a capacitive part and an upper electrode. At this time, when the etching rate of the SOG layer is significantly larger than those of the lower layers and a desired etching rate is unobtainable, the etching rate can be adjusted by annealing the formed SOG layer in oxygen to increase the density of the layer.

BRIEF DESCRIPTION OF THE DRAWINGS

FIGS. 3 to 6(a)–6(i) each show an example of the process for production of the present capacitor.

DETAILED DESCRIPTION OF THE INVENTION AND PREFERRED EMBODIMENTS

Figure 1:
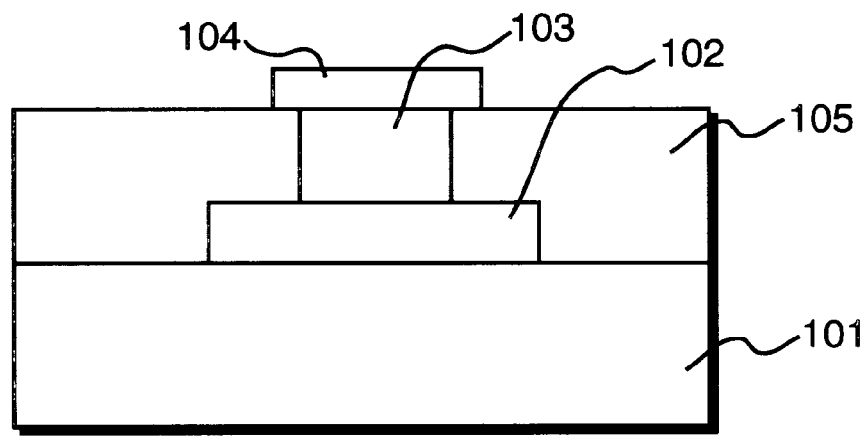
FIG. 1 and FIG. 2 each show a sectional view of an example of the capacitor of the present invention.

The present invention is described with reference to the accompanying drawings. FIG. 1 is a sectional view showing the structure of a capacitor of the present invention. This capacitor has a structure comprising a base 101 for insulating layer, a lower electrode 102, an insulating layer 105, a ferroelectric layer 103 and an upper electrode 104, wherein 102, 105, 103 and 104 are formed on or above the base 101. The thickness of the ferroelectric layer 103 is determined so that the upper surface of the ferroelectric layer 103 is lower than the upper surface of the insulating layer 105. Further, the upper electrode contacts with the upper surface of the ferroelectric layer 103, at an area of the upper electrode which is inside its outer periphery.

The upper electrode 104 and the lower electrode 102 are made of a metal (e.g. Pt or Au) which is sparingly reactive with oxygen even at high temperatures and which can function as an electrode, or a metal (e.g. Ru) which forms, when oxidized, a conductive metal oxide at the interface between the ferroelectric layer 103 and the electrode 102 or 104 and which can function as an electrode, or a conductive metal oxide. FIG. 1 shows a case in which the two electrodes are made of such a material; however, at least one of the two electrodes may be made of such a material, depending upon the desired structure of the capacitor to be produced. Further, each electrode can be formed in a single-layer structure or in a multi-layer structure.

Figure 2:
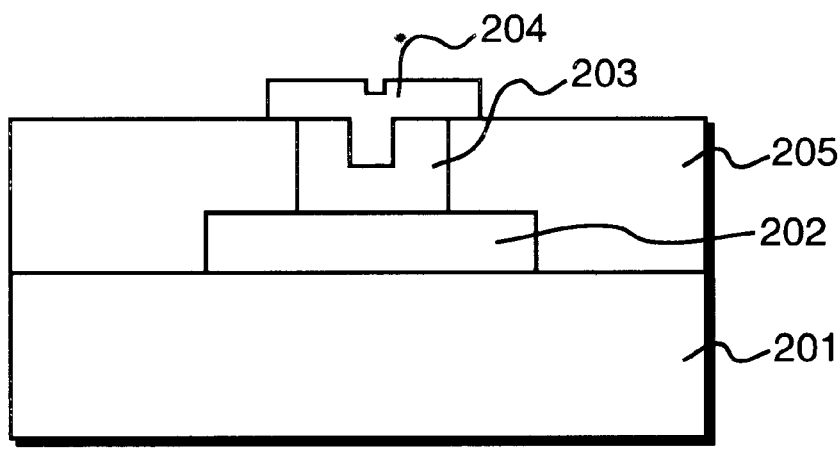

As shown in FIG. 2, the capacitor of the present invention may have a structure in which part of the upper electrode 204 is filled in the hollow formed in the upper portion of the ferroelectric layer 203, or a structure in which the upper electrode 204 is entirely filled in the hollow. In FIG. 2, 201 refers to a base for insulating layer; 202 refers to a lower electrode; 203 refers to a ferroelectric layer; 204 refers to an upper electrode; and 205 refers to an insulating layer.

Further, as shown in FIGS. 6(a)–6(i) the present capacitor may have a structure in which the upper surface of the ferroelectric layer and the upper surface of the upper electrode are flush with the upper surface of the insulating layer. In FIGS. 6(a)–6(i) 601 refers to a silicon substrate; 602 refers to a LOCOS isolating layer; 603a and 603b refer to diffused layers as source and drain regions; 604 refers to a gate oxide layer; 605 refers to a gate electrode; 606 refers to a first insulating layer for layer insulation; 607 refers to a lower electrode; 608 refers to a second insulating layer for layer insulation; 609 refers to a capacitive part; 610 refers to an upper electrode; 611 refers to a third insulating layer for layer insulation; 612a and 612b each refer to a contact hole communicating with a transistor layer; 613a and 613b each refer to a contact hole communicating with a capacitor; and 614a, 614b and 614c each refer to an electrode wiring.

By employing the above structure, the upper surface of the ferroelectric layer 103 is surely covered by the upper electrode 104 even if wrong positioning of mask for light exposure is made in a step for formation of upper electrode; as a result, decrease in effective capacitance area can be prevented.

The capacitor having a structure shown in FIG. 2 can be produced, for example, by a process shown in FIG. 3. Firstly, a lower electrode layer made of Pt, $RuO_2$ or the like is formed on an insulating layer (e.g. an silicon oxide layer) 301 in a thickness of 50–30 nm. The thickness is preferably determined in consideration of the required resistance of lower electrode and the level difference caused by the thickness. The lower electrode layer is processed by lithography and etching by sputtering, to obtain a lower electrode 302 [FIG. 3(a)]. Then, on the surfaces of the insulating layer 301 and the lower electrode 302 is formed a silicon oxide layer in a thickness of 200–600 nm. In this layer formation, a method such as CVD, spin coating or the like can be used. When CVD is used, the silicon oxide layer can be formed rapidly, which makes it possible to use a low-melting material for a layer(s) beneath or below the lower electrode 302. When spin coating is used, the silicon oxide layer can be formed as a layer having a flat surface. When the silicon oxide layer is formed as a BPSG, PSG or BSG layer, the layer can easily have a flat surface by a heat treatment. When such a BPSG, PSG or BSG layer is used, the heat treatment for surface flattening is desirably conducted at a temperature which is 800° C. or higher but at which the properties required for the silicon oxide layer are not impaired.

When the silicon oxide layer formed is a layer difficult to have a flat surface by a heat treatment, the surface can be made flat by chemical mechanical polishing (CMP). In the case of FIG. 3, a silicon oxide layer is used as the insulating layer formed so as to contact with the side of the ferroelectric layer. This insulating layer is made of a dielectric having a dielectric constant smaller than that of the ferroelectric layer so that the ferroelectric layer can exhibit the functions required for the capacitive part of capacitor. The dielectric constituting the insulating layer can be, for example, silicon oxide or silicon nitride.

Figure 3A:
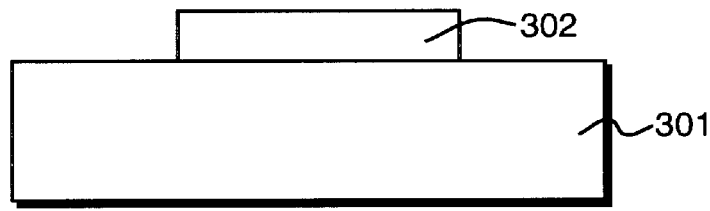
Figure 3B:
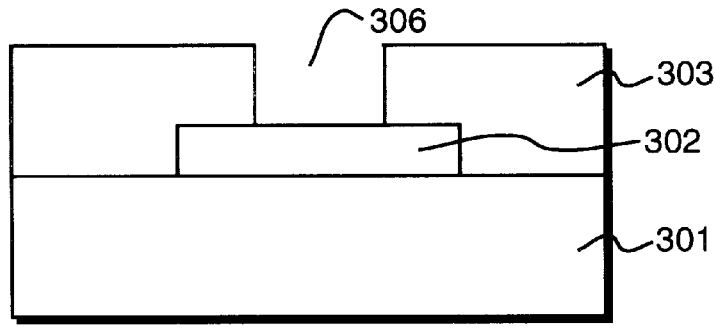
Figure 3C:
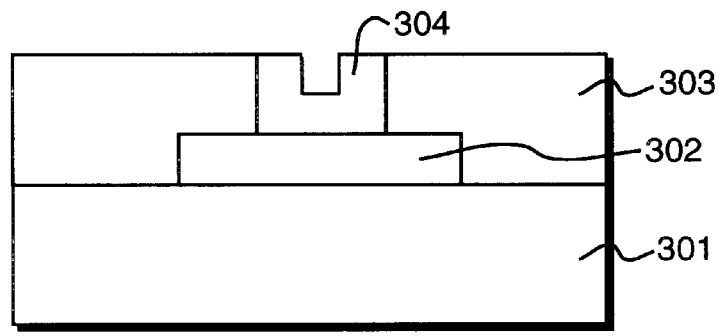

Then, the silicon oxide layer is subjected to wet etching or dry etching to form therein an opening 306 which is inside the outer periphery of the lower electrode 302 [FIG. 3(b)]. The size of the opening can be determined in consideration of the size of the lower electrode and the precision of the etching applied; in the case of a capacitor formed in a memory cell, the size can be, for example, 0.1–4 μm (width) which is a necessary size for the memory cell. Next, a ferroelectric layer is formed, and a portion of the ferroelectric layer on the silicon oxide layer 303 is removed to form, in the opening, a capacitive part 304 made of a ferroelectric [FIG. 3(c)]. The ferroelectric layer can be formed by sputtering, CVD, a sol-gel method or the like, and a ferroelectric layer made of PZT ($PbZr_xTi_{1-x}O_3$), $SrBi_2Ta_2O_9$ or the like can be formed in a thickness of 50–400 nm. The temperature employed during the formation of the ferroelectric layer can be appropriately determined depending upon the method for layer formation, the material for layer, etc. 550–650° C. is suitable in formation of a PZT layer by sputtering. After the formation of the ferroelectric layer, an annealing treatment in oxygen can be applied as necessary when the treatment is effective for the improvement of layer properties, such as increase in polarization and the like.

When the ferroelectric layer has been formed, the ferroelectric layer is on the silicon oxide layer 303 and on the area of the upper electrode 302 exposed in the opening 306. By conducting polishing by, for example, CMP until the surface of the silicon oxide layer 303 is exposed, a structure shown in FIG. 3(c) can be obtained. This polishing by CMP can be replaced by the whole surface etching by plasma dry etching or ion milling when the ferroelectric layer has a relatively flat surface, whereby the unnecessary portion of the ferroelectric layer can be removed. When CMP is used, post-treatments are necessary such as removal of polishing solution, washing of leavings of polishing and the like. Use of plasma dry etching or ion milling can eliminate such post-treatments. However, a non-plasma treatment such as CMP or the like is preferred when the plasma used has adverse effects on the ferroelectric layer.

Figure 3D:
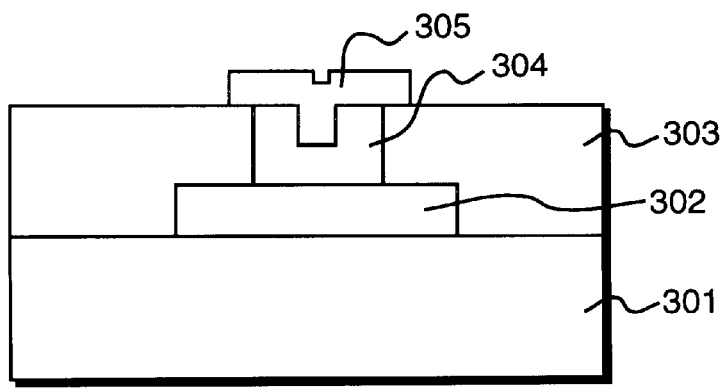

Next, an upper electrode metal layer is formed in a thickness of, for example, 50–300 nm and then processed according to an ordinary method to form an upper electrode 305, whereby a capacitor can be obtained [FIG. 3(d)]. In the above processing to obtain an upper electrode 305, there can be used, for example, dry etching using a chlorine type gas.

Figure 4A:
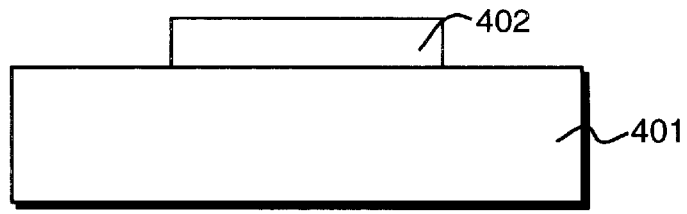
Figure 4B:
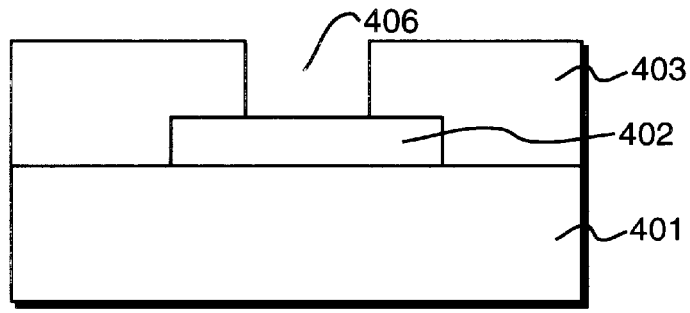
Figure 4C:
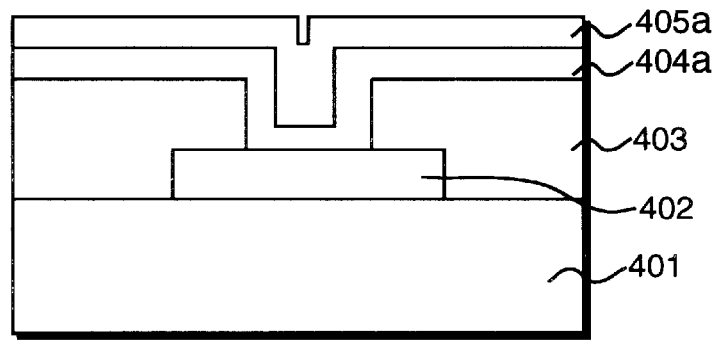
Figure 4D:
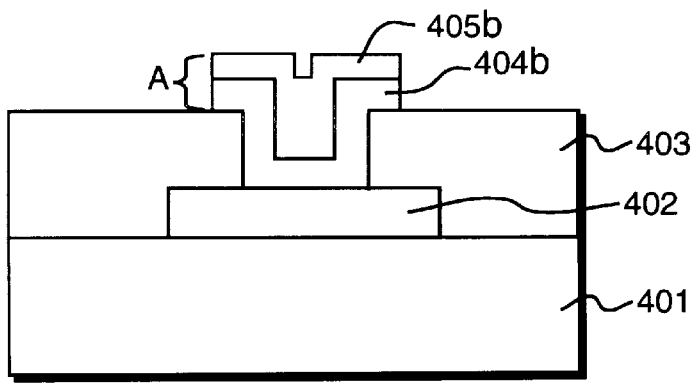

The ferroelectric layer and the upper electrode layer may be formed successively in this order and then processed. This approach provides simplified processing, that is, the times of light exposure can be reduced by one time. For example, as shown in FIGS. 4(a) and 4(b), the steps to the formation of an insulating layer 403 having an opening 406 are conducted according to the same procedure as described in FIG. 3. Then, a ferroelectric layer 404a and an upper electrode layer 405a are formed successively [FIG. 4(c)]. In FIG. 4, 401 refers to a base for insulating layer; 402 refers to a lower electrode; and 406 refers to an opening.

The thicknesses of the ferroelectric layer 404a and the upper electrode layer 405a can be the same as mentioned in FIG. 3. Then, the two layers are processed by a combination of lithography and dry etching to form a capacitive part 404b (made of a ferroelectric) and an upper electrode 405b [FIG. 4(d)]. The portion protruding from the surface of the silicon oxide layer 403 by a distance A may as necessary be removed by CMP or the like to flatten the upper surface of the resulting capacitor.

The following approach may also be taken. When the material of FIG. 4(c) has been obtained, a silicon oxide layer is formed on the upper electrode layer 405a; successively, the surface of the silicon oxide layer is flattened as necessary; then, the whole surface of the silicon oxide layer is etched back until the insulating layer 403 is exposed; thereafter, a heat treatment is conducted to alleviate the defect in the ferroelectric layer (which is presumed to appear during the etching-back by plasma)—the temperature of the heat treatment is, for example, about 80° C. when the ferroelectric layer is made of $SrBi_2Ta_2O_9$; thereby, a capacitive part and an upper electrode are formed. According to this approach wherein a silicon oxide layer is formed and then etched back, the portions of the ferroelectric layer and the upper electrode, protruding from the insulating layer by a distance A [see FIG. 4(d)] can be removed (lowered) or eliminated without reducing the thickness of the insulating layer, and a capacitor of flat surface can be obtained effectively. Simultaneously, the deterioration of capacitor properties appearing during the production of capacitor can be alleviated or prevented.

Further, the silicon oxide layer formed on the upper electrode layer may be a flat SOG layer formed by spin coating, or may be a boron or phosphorus-containing silicon oxide layer whose surface has been flattened by a heat treatment. In this surface flattening, chemical mechanical polishing (CMP) can be employed.

The present invention is described specifically below with reference to Examples.

EXAMPLE 1

Figure 5D:
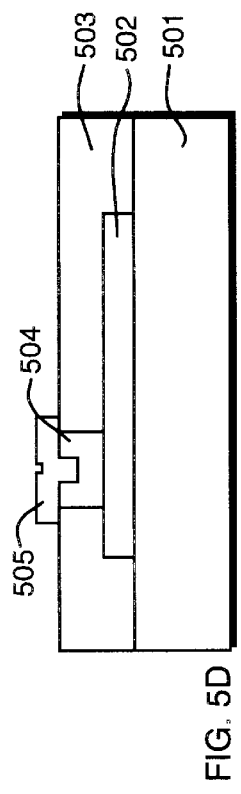
Figure 5E:
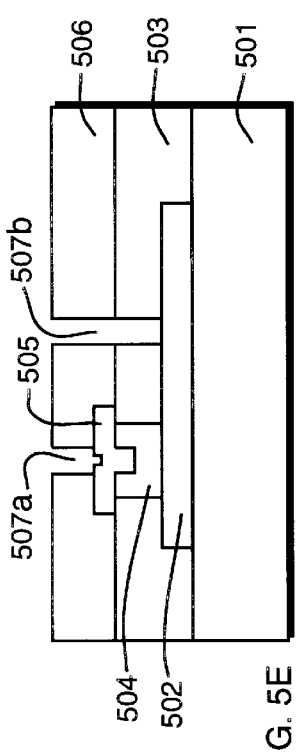
Figure 5F:
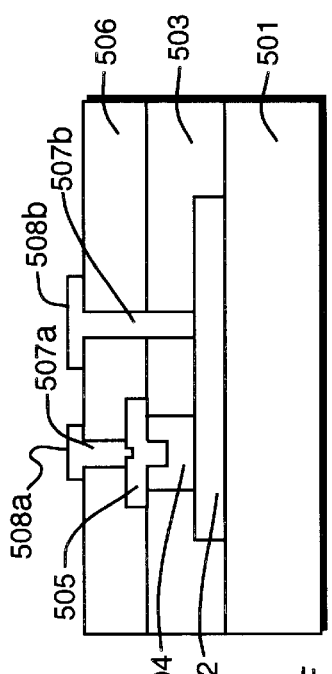
Figure 5A:
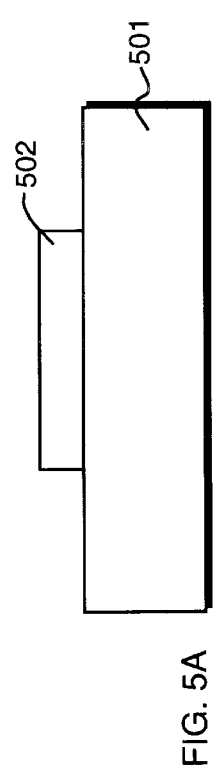
Figure 5B:
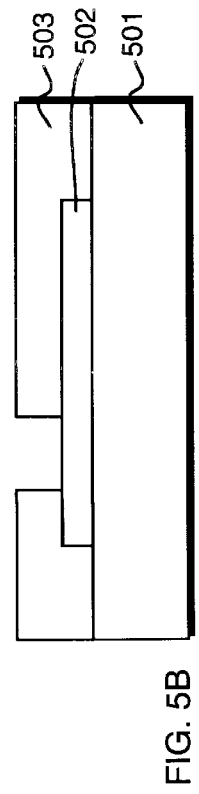

The first embodiment of the present invention is described with reference to FIG. 5. At first, a Pt lower electrode layer was formed on a base 501 for silicon oxide layer by sputtering. Ion milling via a resist mask was applied for patterning, to obtain a lower electrode 502 [FIG. 5(a)]. Then, a silicon oxide layer was formed by CVD in a thickness of 300 nm. Therein was formed, as shown in FIG. 5(b), an opening having a 2 μm×2 μm square section (a section parallel to the upper surface of the lower electrode), by dry etching using a resist mask, to obtain a silicon oxide layer 503 as an insulating layer for layer insulation. This silicon oxide layer may be a silicon nitride layer.

Figure 5C:
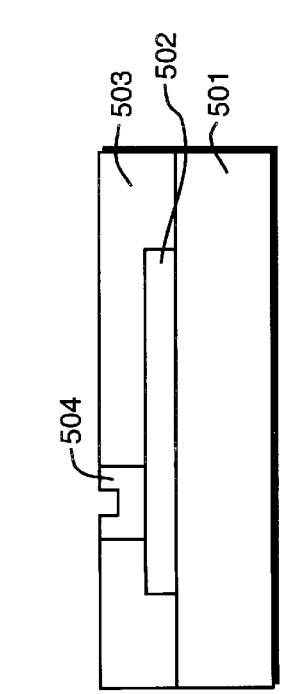
Figure 7:
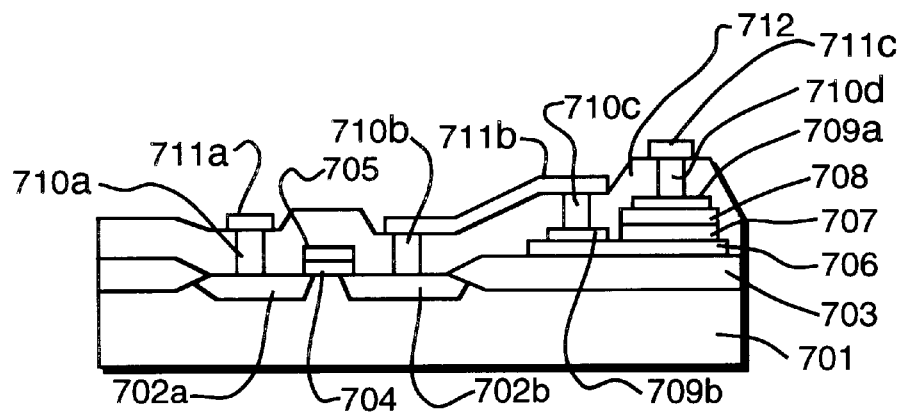
FIGS. 7 to 9 each show a sectional view of a capacitor of conventional technique.
Figure 8:
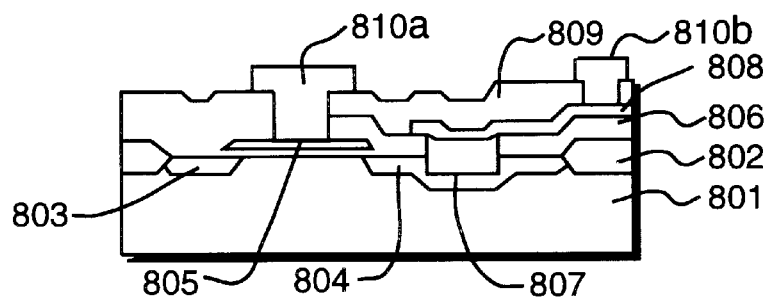
Figure 9:
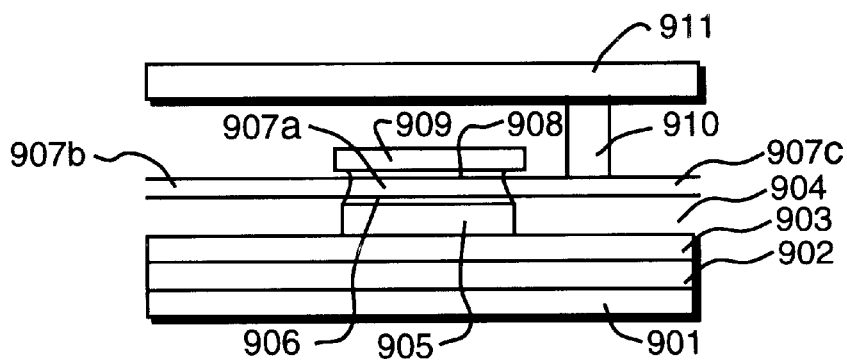

Successively, a $SrBi_2Ta_2O_9$ ferroelectric layer was formed by sputtering in a thickness of 100 nm, and its unnecessary portion on the silicon oxide layer 503 was removed to obtain a capacitive part 504 made of a ferroelectric layer [FIG. 5(c)]. The above sputtering is conducted by RF sputtering, but may be conducted by DC sputtering using a metal target. In this case, an oxygen/Ar or Xe mixed gas can be effectively used as a gas for sputtering plasma generation. The formation of a ferroelectric layer may be conducted by CVD) or MOD (sol-gel method). Then, surface polishing is conducted by CMP and the ferroelectric layer on the silicon oxide layer is removed to leave the ferroelectric layer only in the opening. Then, a Pt upper electrode layer was formed by sputtering in a thickness of 150 nm, after which etching using a resist mask was conducted to obtain an upper electrode 505 [FIG. 5(d)].

Next, an ozone-TEOS layer 506 as a second insulating layer for layer insulation was formed in a thickness of 400 nm, followed by formation of contact holes 507a and 507b reaching the upper electrode and the lower electrode, respectively. A Ti/TiN barrier layer was formed, after which an Al-based wiring layer made of AlSiCu or the like was formed and processed to obtain metal wirings 508a and 508b, whereby a capacitor was completed.

EXAMPLE 2

The second embodiment of the present invention is described with reference to FIG. 6. At first, as shown in FIG. 6(a), an insulating layer 602 for isolation of elements was formed on a silicon substrate 601 by a LOCOS process. The thickness of the insulating layer 602 can be selected from a range of about 300 to 500 nm. 400 nm was used. Next, as shown in FIG. 6(b), there was formed, in an element region, a MOS transistor whose gate electrode 605 was made of a polysilicon. The length of the gate was 0.6 μm. The formation of diffused layers (source and drain) was conducted by a combination of arsenic ion implantation and a heat treatment. As shown in FIG. 6(c), a silicon oxide layer was formed as a first insulating layer 606 for layer insulation, by CVD in a thickness of 500 nm. Then, a PT lower electrode layer (which later became a lower electrode 607 of capacitor) was formed by sputtering in a thickness of 150 nm. In this case, a Ti layer may be formed beneath the PT lower electrode layer in a thickness of 10–50 nm so as to function as an adhesive layer between the PT lower electrode layer and the silicon oxide layer. The PT lower electrode layer was processed by milling using a resist mask or by RIE etching to form a lower electrode 607 [FIG. 6(d)]. Successivey, a SOG silicon oxide layer was formed as a second insulating layer 608 for layer insulation [FIG. 6(e)]. In this SOG layer formation, a raw material solution was spin-coated and then baked at a low temperature of about 200–300° C., after which a heat treatment was conducted at 600–800° C. in an atmosphere containing oxygen, to obtain a layer of high density.

In a desired portion of the SOG layer on the lower electrode 607 was formed an opening having a 0.3 μm×0.3 μm square section (a section parallel to the upper surface of the lower electrode), by etching using a resist mask. Then, a PZT ferroelectric layer (which later became a capacitive part 609) was formed by sputtering in a thickness of 150 nm, followed by a heat treatment at 600° C. in an atmosphere containing oxygen, for improvement of layer quality. Successively, a Pt upper electrode layer (which later became an upper electrode 610) was formed in a thickness of 150 nm [FIG. 6(f)]. The Pt upper electrode layer was subjected to chemical mechanical polishing so that the surface of the second insulating layer 608 was exposed and the ferroelectric layer 609 and an upper electrode 610 remained in the opening [FIG. 6(g)]. The upper electrode 610 may be made of a metal (e.g. Ru) which is conductive even when oxidized to become an oxide. As shown in FIG. 6(h), an ozone-TEOS insulating layer 611 for coverage of capacitor was formed in a thickness of 400 nm, after which contact holes 612a, 612b, 613a and 613b were formed. Further, a Ti/TiN barrier layer was formed. Thereon was formed an AlSiCu layer was formed. Lastly, as shown in FIG. 6(i), etching using a resist mask was conducted to form metal wirings 614a, 614b and 614c, whereby an integrated circuit having a MOS transistor and a capacitor was obtained.

In the capacitor of the present invention, the ferroelectric layer on the lower electrode is already covered at the side with an insulating layer, at a timing of formation of the upper electrode; therefore, no short-circuiting occurs between the upper electrode and the lower electrode even if wrong positioning of mask for light exposure takes place in a step for formation of the upper electrode. Moreover, when the upper electrode is formed in a size larger than the upper surface of the capacitive part, reduction in effective capacitance area can be prevented even if wrong positioning of mask for light exposure takes place in a step for formation of the upper electrode. Further, when the present capacitor has been formed, the insulating layer is already formed so as to cover even the upper surface of the capacitor, and it is not necessary to form the insulating layer in a state having level differences as in a case that the capacitive part is formed prior to the insulating layer; therefore, the present capacitor can be formed even in a large scale integrated circuit where a numbe rof capacitors must be disposed at small intervals. Furthermore, in the present capacitor, it is possible to effectively reduce the water content in the insulating layer surrounding the side of the ferroelectric layer, whereby the problem caused by the water content can be prevented.

What is claimed is:

1. A capacitor comprising an upper electrode, a lower electrode and a capacitive part made of a ferroelectric, interposed between the upper and lower electrodes, at least one of the electrodes having a single-layer or multi-layer structure made of a metal sparingly reactive with oxygen, or a metal having conductivity even when oxidized to become an oxide, or a conductive metal oxide, wherein the capacitive part is formed on an area of the lower electrode which is inside the outer periphery of the lower electrode, the side of the capacitive part is covered by an insulating layer having a dielectric constant smaller than that of the ferroelectric constituting the capacitive part, and the upper surface of the capacitive part contacts with an area of the upper electrode which is inside the outer periphery of the upper electrode, wherein the upper surface of the capacitive part and the upper surface of the upper electrode are flush with each other.

2. A capacitor according to claim 1, wherein the insulating layer is made of silicon oxide or silicon nitride.

3. A capacitor according to any of claim 1, wherein the upper electrode or the lower electrode is made of Pt, Au or Ru.

4. A capacitor according to claim 1, wherein the ferroelectric layer is made of PZT or $SrBi_2Ta_2O_9$.

5. A capacitor comprising an upper electrode, a lower electrode and a capacitive part made of a ferroelectric, interposed between the upper and lower electrodes, at least one of the electrodes having a single-layer or multi-layer structure made of a metal sparingly reactive with oxygen, or a metal having conductivity even when oxidized to become an oxide, or a conductive metal oxide, wherein the capacitive part is formed on an area of the lower electrode which is inside the outer periphery of the lower electrode, the side of the capacitive part is covered by an insulating layer having a dielectric constant smaller than that of the ferroelectric constituting the capacitive part, and the upper electrode is partially or wholly disposed in a hollow formed in the upper portion of the capacitive part.

6. A capacitor according to claim 5, wherein the upper surface of the capacitive part is lower than the upper surface of the insulating layer.

7. A capacitor according to claim 5, wherein the upper surface of the capacitive part and the upper surface of the upper electrode are flush with each other.

8. A capacitor according to claim 5, wherein the upper surface of the capacitive part contacts with an area of the upper electrode which is inside the outer periphery of the upper electrode.

9. A capacitor according to claim 5, wherein the insulating layer is made of silicon oxide or silicon nitride.

10. A capacitor according to claim 5, wherein the upper electrode or the lower electrode is made of Pt, Au or Ru.

11. A capacitor according to claim 5, wherein the ferroelectric layer is made of PZT or $SrBi_2Ta_2O_9$.

* * * * *